United States Patent [19]

Mazuré et al.

[11] Patent Number: 5,314,834
[45] Date of Patent: May 24, 1994

[54] FIELD EFFECT TRANSISTOR HAVING A GATE DIELECTRIC WITH VARIABLE THICKNESS

[75] Inventors: Carlos A. Mazuré; Marius K. Orlowski, both of Austin, Tex.

[73] Assignee: Motorola, Inc., Schaumburg, Ill.

[21] Appl. No.: 750,155

[22] Filed: Aug. 26, 1991

[51] Int. Cl.$^5$ .................. H01L 21/265; H01L 29/68
[52] U.S. Cl. ........................ 437/43; 437/189; 437/191; 437/192; 437/235; 437/913; 257/324; 257/340; 257/389
[58] Field of Search ............... 357/23.4, 23.5; 437/43, 437/189, 191, 192, 913, 228, 235; 257/324, 340, 389

[56] References Cited

U.S. PATENT DOCUMENTS 5,051,794 9/1991 Mori .............................. 357/23.5

Primary Examiner—Edward Wojciechowicz
Attorney, Agent, or Firm—Keith E. Witek

[57] ABSTRACT

A field effect transistor, FET, (11) having a gate dielectric of varying thickness (14, 24) to improve device performance. The FET (11) is made on a substrate (10) and has a control electrode, or gate (16), and two current electrodes, or source and drain regions (28), which are separated by a channel region. The gate (16) is separated from the channel region by a gate dielectric. The gate dielectric has a centrally located first region that is of a first thickness (14) and a second region which is adjacent a perimeter of the first region that is of a second thickness (24). The second thickness (24) is made greater than the first thickness (14).

5 Claims, 4 Drawing Sheets

FIELD EFFECT TRANSISTOR HAVING A GATE DIELECTRIC WITH VARIABLE THICKNESS

FIELD OF THE INVENTION

The present invention relates generally to semiconductor transistors, and more particularly, to field effect transistors (FETs).

BACKGROUND OF THE INVENTION

When NMOS, PMOS and CMOS technologies were first put into production in the semiconductor industry most metal oxide semiconductor field effect transistors (MOSFETs) were fabricated with relatively thick gate oxides. For most applications gate oxides or gate dielectrics are used to isolate a conductive gate region from a substrate region which is usually called a channel. The thicker gate oxides gave the advantages of: (1) almost no leakage current resulting from valence band to conduction band transitions; (2) less MOSFET degradation with time, i.e. improved lifetime by reducing a well-known gate damaging hot electron injection phenomena; and (3) less Miller Capacitance, i.e. less gate-to-source and gate-to-drain capacitance which helps to improve on-to-off and off-to-on switching speed. However, the thicker gate oxides resulted in low gain or low current capability and short channel effects such as Drain Induced Barrier Lowering (DIBL) which adversely affect MOSFET turn on voltages or threshold voltages. DIBL is a phenomena that drastically reduces threshold voltages as the channel region length is reduced or, in other words, as the channel becomes a short channel.

To improve the performance and density of the MOSFET, the semiconductor industry began to shrink the geometry of this device not only in terms of surface area but also in terms of dielectric thickness which primarily involved the gate dielectric. As the gate dielectric was reduced in thickness, MOSFETs gained the advantage of higher source-to-drain currents which improved gain and resulted in a reduction of unwanted short channel behavior. The thinner gate dielectric also produced undesirable results, such as: (1) a higher gate current leakage from source-to-gate, from drain-to-gate and from channel-to-gate due to hot carrier effects; (2) valence band to conduction band current leakage in the source and drain; (3) strong degradation of the gate and therefore a shorter lifetime; and (4) larger Miller Capacitance which slowed the device. As the MOSFET size continued to shrink towards submicron sizes, it was realized that a new technology would have to be developed to keep current leakage and capacitance from becoming too extreme and performance limiting. This new technology had to be capable of further size reduction due to the fact that all the MOSFETs used up to this point in time were no longer electrically or mechanically capable of further reduction.

To correct some of the problems resulting from thin gate oxides and to allow further device size reduction in MOSFETs, Lightly Doped Drain (LDD) transistor structures were researched. LDD transistors helped reduce hot carrier effects and improve MOSFET lifetime as is taught in U.S. Pat. No. 4,951,100, issued Aug. 21, 1990, by Louis C. Parillo, entitled, "Hot Electron Collector for a LDD Transistor" and assigned to the assignee hereof. Although LDD transistor structures improved lifetime by reducing hot carrier effects, the structures, in general, did little to improve upon Miller Capacitance switching speed problems, short channel effects, and other typical thin dielectric MOSFET shortcomings. Not being able to shrink the presently existing LDD structures below critical dimensions of roughly 0.5 micron ($\mu$) without introducing heavy current leakage and DIBL also hindered further progress.

A transistor structure referred to as an "Inverse T LDD" structure was also proposed. Although this transistor structure and other variations of this type of structure made some improvements over most thin gate MOSFET structures and LDD transistor structures, a noted disadvantage of Inverse T LDD MOSFETs is large pitch and therefore poor circuit density. In addition, the Inverse T LDD transistor structure still does not greatly improve upon valence band to conduction band transition leakage current or Miller Capacitance.

SUMMARY OF THE INVENTION

The previously mentioned needs are fulfilled and other advantages achieved with the present invention, in which a field effect transistor (FET) and method of formation is provided. The field effect transistor has a gate oxide of variable thickness. In one form, the FET has a substrate material of a first conductivity type. First and second current electrode regions of a second conductivity type are formed in the substrate material and separated by a channel region. A control electrode is formed overlying the channel region and between the first and second current electrode regions. A control electrode dielectric is formed overlying the channel region between the channel region and the control electrode. The control electrode dielectric has a first predetermined thickness in a first region which is centrally located beneath the control electrode and a second predetermined thickness in a second region which is adjacent a perimeter of the control electrode. The second predetermined thickness of the control electrode dielectric is made greater than the first predetermined thickness for: (1) minimizing hot carrier injection of the channel region and first and second current electrodes; (2) minimizing capacitance between the control electrode and the first and second current electrodes; and (3) reducing leakage current between the first and second current electrodes.

The present invention will be understood by one skilled in the art from the detailed description below in conjunction with the accompanying drawings.

DESCRIPTION OF A PREFERRED EMBODIMENT

Figure 1A:
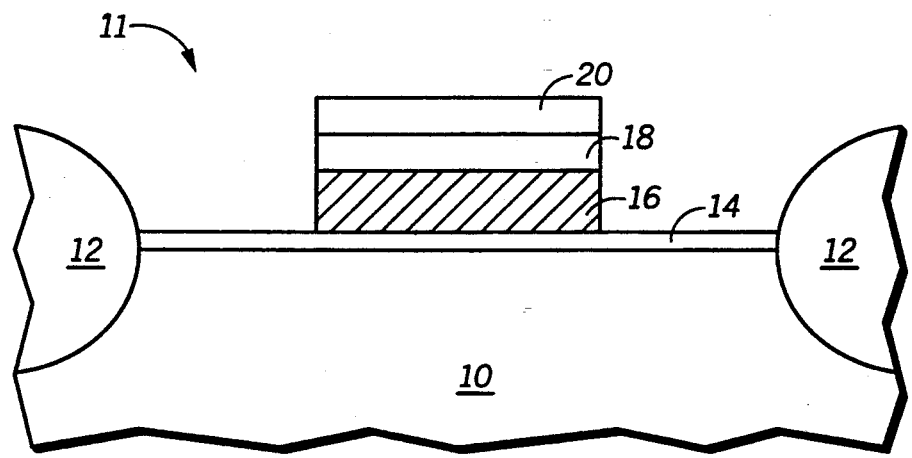
FIGS. 1A-1H illustrate, in cross-sectional form, a semiconductor device fabrication process for forming a FET in accordance with the present invention.

As stated previously, the need exists for a device that can gain all the advantages of a thin dielectric gate MOSFET, such as large source-to-drain current for high gain and good short channel behavior, while still preserving the thick dielectric gate advantages, such as: (1) low current leakage both in terms of valence band to conduction band leakage current and hot carrier injection phenomena; (2) less gate degradation for improved lifetime; (3) improved short channel behavior; and (4) smaller capacitance for greater switching speeds. The device also needs to be capable of dimension shrinking into the submicron dimensions required for development of future technology.

Illustrated in FIGS. 1A-1H are cross-sectional diagrams which sequentially depict a process for forming an FET in accordance with the present invention. FIGS. 1A-1H illustrate the development of a device 11 having all the needs previously mentioned. Device 11 has a substrate 10 which can be silicon, either of P-type or N-type conductivity, or any other semiconducting starting material and a dielectric layer 12 usually referred to as a field oxide. The dielectric layer 12 is usually grown or deposited on the substrate 10 and removed in selected areas to form open areas or active areas where FETs can be placed. Device 11 also has a relatively thin dielectric layer in the active area which can in most cases be thermally grown or deposited and is usually referred to as a gate oxide or gate dielectric 14. A conductive layer, referred to as a gate 16, overlies the gate dielectric 14. The gate 16 is usually formed of either a material containing metal, a metal, polysilicon, or some other conducting material. Overlying the gate 16 is a dielectric layer 18 which is, in most cases, a deposited oxide. Overlying the dielectric layer 18 is another dielectric layer 20 which is usually a nonoxidizing dielectric substance such as nitride. The dielectric layers 18 and 20 are used to protect the gate 16 from impurities, mechanical and electrical damage, and other potential harm.

Figure 1B:
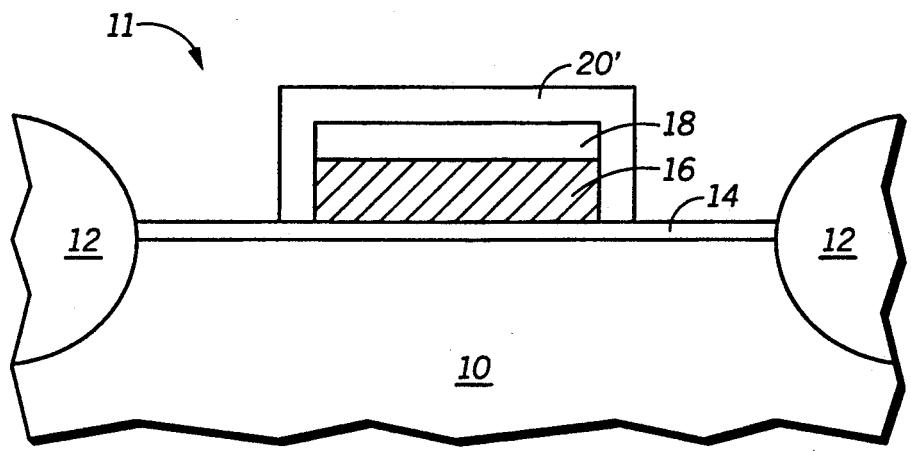

FIG. 1B depicts the formation of a dielectric cap 20' around all exposed faces of the gate by including dielectric layer 20. While the dielectric layers 18 and 20 are used for gate protection from damage and impurities, dielectric cap 20' is used to protect the gate not only vertically but laterally as well. The dielectric cap 20' completely encompasses the gate 16 and dielectric layer 18 and terminates on the gate dielectric 14.

Figure 1C:
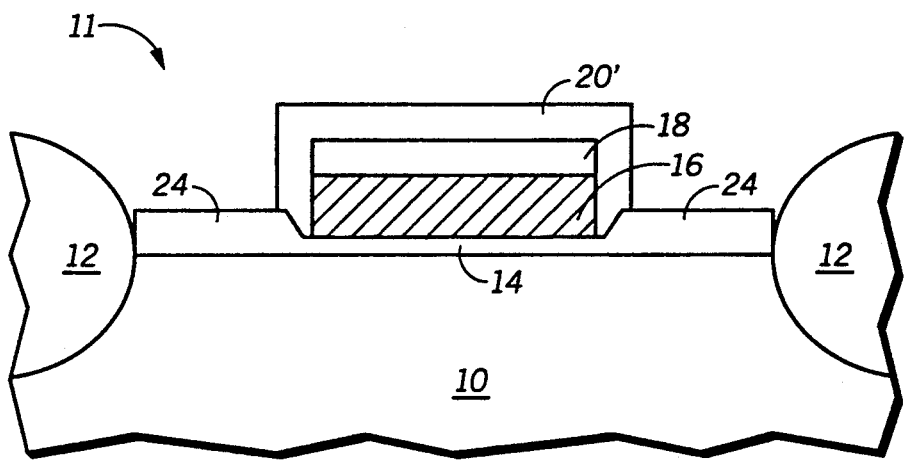

FIG. 1C illustrates the next step in the process which is to form a thicker gate dielectric 24 overlying the gate dielectric 14. All surface areas of gate dielectric 14 that are not covered by the gate 16 or the dielectric cap 20' are covered by the gate dielectric 24 although the gate dielectric 24 could be further confined. The thicker gate dielectric 24 encroaches slightly under dielectric cap 20' forming a two-level stair stepping or sloping dielectric region formed by the gate dielectric 24 and gate dielectric 14. The dielectric cap 20' has now performed its function of protection and is etched off of the gate by using any of several etch techniques.

Figure 1D:
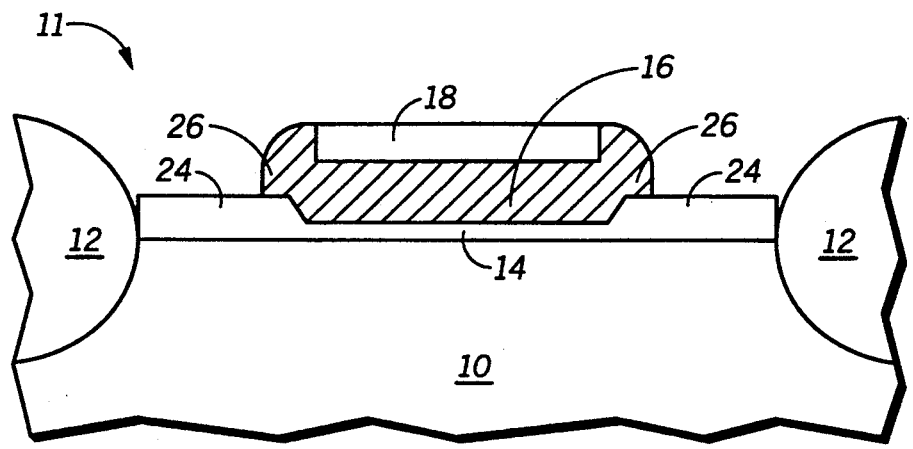

FIG. 1D shows a cross sectional diagram of a lateral gate extension step. The gate 16 is extended laterally by a gate extension 26. The gate extension 26 is generally made of either: (1) a metal containing substance; (2) a metal; (3) polysilicon; or (4) some other conducting material, and can be formed using one or many of several lateral layer forming techniques such as spacer technology, Chemical Vapor Deposition (CVD) steps, or growth techniques. The gate extension 26 will form over the thicker gate dielectric 24 to some predetermined amount.

Figure 1E:
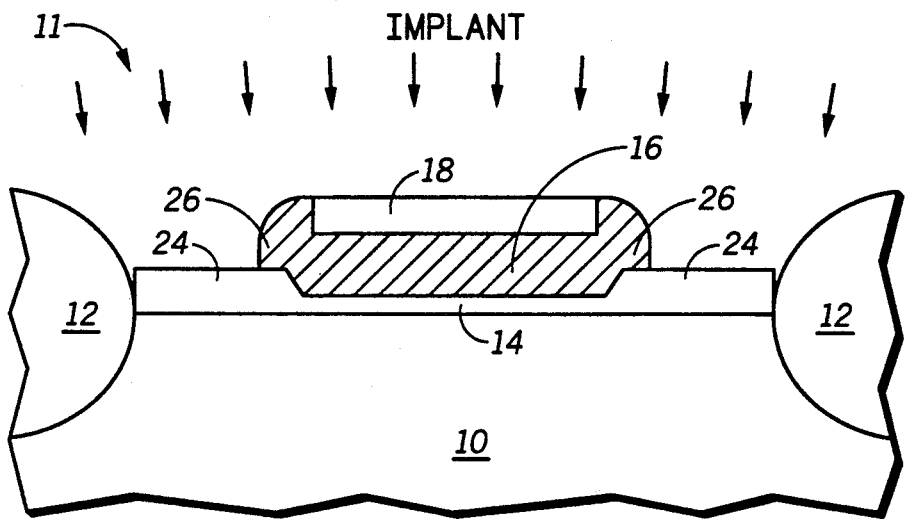
Figure 1F:
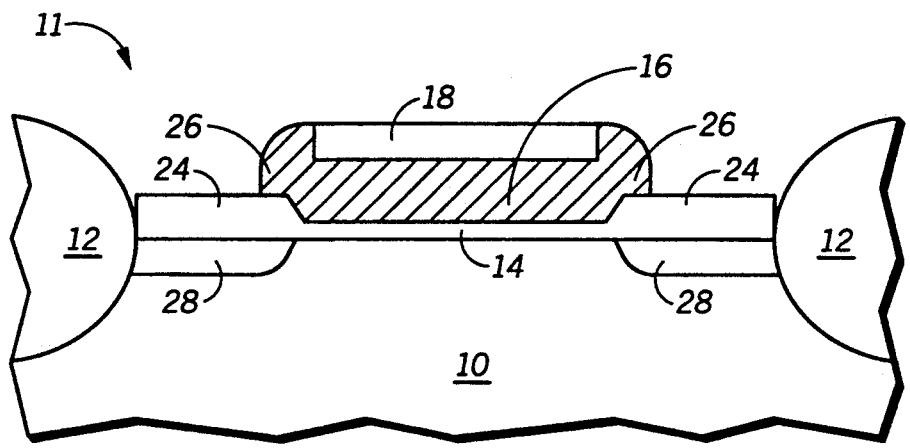

FIG. 1E depicts one step in the formation of current electrodes otherwise known as a source and a drain. The source and drain electrodes of device 11 can be formed in many ways. One conventional way of forming source and drains, as depicted in FIG. 1E, is to ion implant impurities of the opposite conductivity type of substrate 10, either N-type or P-type, into the substrate 10. Ion implanting is a method of depositing impurities into a layer or substrate by accelerating the impurities in a direct path. The accelerated impurities form a thin current stream of high velocity impurities that deposit themselves into layers or a substrate by impact. An anneal phase, which usually involves heating the device, follows the implant and further forms the source and drain by repairing any damage that ion impacting may have caused and thermally spreading out the impurities. Another common method to form a source and a drain is to use diffusion technology. Diffusion technology is similar to implant technology but does not involve high velocity impact and is typically implemented at higher temperatures than implanting.

Once the impurities have been established in the substrate from the techniques discussed previously, FIG. 1F illustrates the location of the source and drain regions 28. The source and drain regions 28 extend vertically from the gate dielectric 24 into the substrate 10 by a controllable distance. Laterally, the source and drain regions 28 are confined to an area under the gate dielectric 24 and adjacent to the dielectric layer 12. The source and drain regions 28 are kept from forming near or under the gate dielectric 14. The region in substrate 10 between the source and drain regions 28 is known as the channel. This channel can also, at several points in the FIG. 1A-1H flow, be implanted or altered in many ways to improve the performance of the device.

Figure 1G:
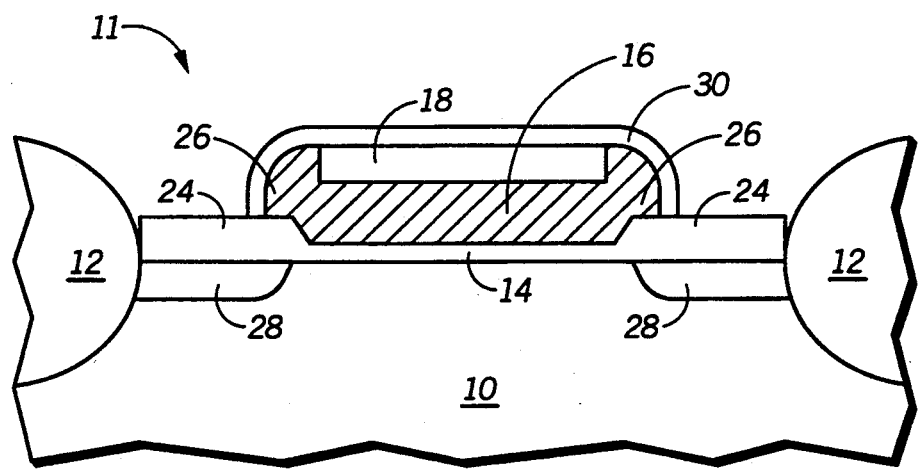

FIG. 1G illustrates a second gate dielectric formation referred to as a dielectric layer 30. Dielectric layer 30 completely covers all faces of the exposed gate 16 and dielectric layer 18. The dielectric layer 30 comes in contact with the thick gate dielectric 24. Dielectric layer 30 is provided for electrical isolation and protection of gate 16. The addition of other dielectric layers, such as dielectric layer 30, may or may not add to the thickness of other layers across device 11, such as dielectric layer 12 and gate dielectric 24, depending upon the formation technique used.

Figure 1H:
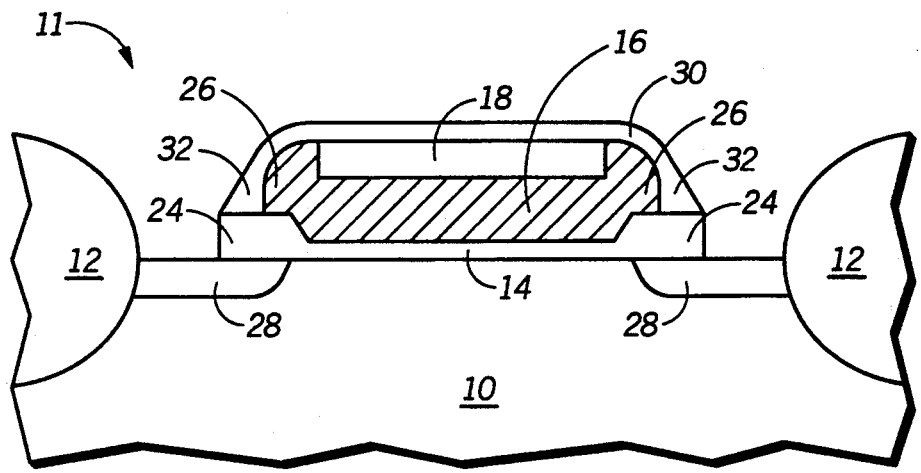

After the dielectric layer 30 is formed over the gate 16, another oxide is formed over dielectric layer 30 using one or more of several techniques such as CVD, spacer technology or growth technology. A new dielectric extension region 32 is illustrated in FIG. 1H and adds thickness to the dielectric layer 30 in a uniform or non-uniform manner depending on the application. For most applications the dielectric will cover all of dielectric layer 30 and will be more slender at the top of the gate 16 while being formed wider closer to the gate dielectric 24 or closer to the bottom of the gate 16.

Figure 2:
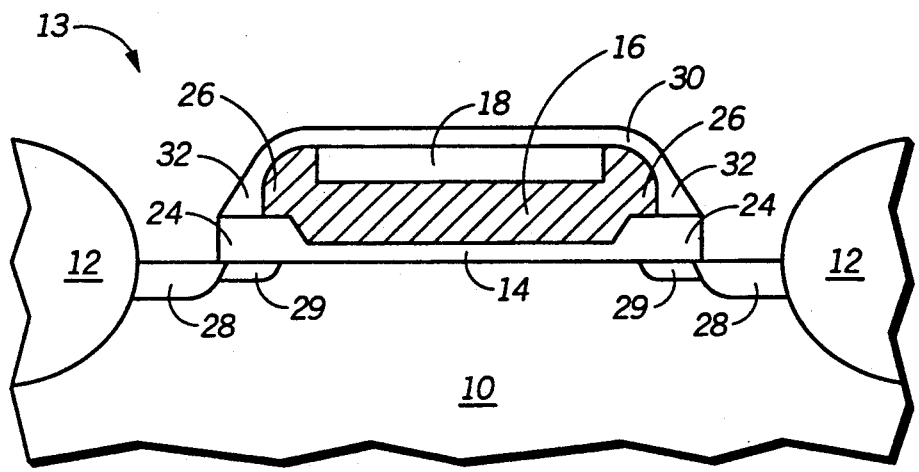
FIG. 2 illustrates, in cross-sectional form, an alternative FET structure subsequent to FIG. 1D in accordance with the present invention.

While the present invention has been depicted and described with reference to a specific embodiment, further modifications and improvements will occur to those skilled in the art. For example, FIG. 2 illustrates an alternative structure that can result from a process similar to the process discussed in FIGS. 1A-1H. FIG. 2 illustrates a device 13 which is device 11 fabricated slightly different to illustrate how lightly doped drain (LDD) technology could be added in accordance with the present invention. The conductive gate extension 26 illustrated in FIG. 1D could either be fabricated as spacers or used as spacers for the LDD formation of the LDD current electrodes 29. The regions occupied by the LDD current electrodes 29 are usually referred to as the LDD source and drain regions and are formed using the same principles discussed for FIG. 1E. The formation of the dielectric extension region 32, which was depicted in FIG. 1H, can either be fabricated as or used as spacers for the source and drain formation of the source and drain regions 28. The source and drain regions 28 are usually referred to as the highly doped drain (HDD) regions.

Figure 3:
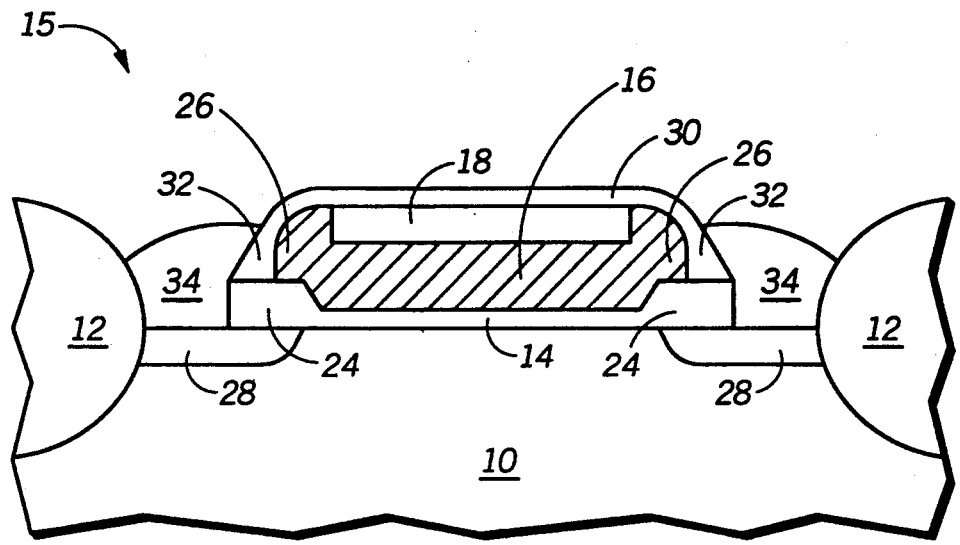
FIG. 3 illustrates, in cross-sectional form, an alternative FET structure subsequent to FIG. 1D in accordance with the present invention.

FIG. 3 depicts another alternative structure resulting from the process flow followed for device 11 in FIGS. 1A-1H. FIG. 3 illustrates a device 15 which has an added selective source and drain extension step that would occur after the process steps in FIG. 1H. Source and drain extensions 34 are elevated source and drain regions which are, in most cases, formed by selective silicon epitaxy where the substrate 10 is silicon. Source and drain extensions 34 are additional substrate material that is formed to provide a larger surface area connection to the source and drain regions 28. The formation of the elevated source and drain extensions 34 is confined to a region defined by the dielectric layer 12, the lateral dielectric extension region 32, and the source and drain regions 28. It should be noted that some of the source and drain regions 28 could be consumed by the formation of the elevated source and drain extensions 34.

Figure 4:
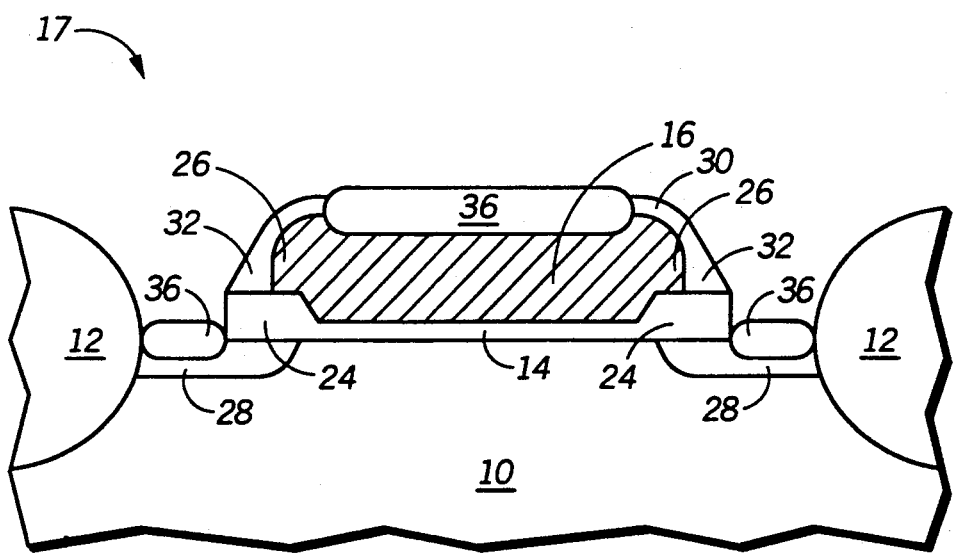
FIG. 4 illustrates, in cross-sectional form, an alternative FET structure subsequent to FIG. 1D in accordance with the present invention.

FIG. 4 illustrates another alternative structure resulting from the process flow followed for device 11 in FIGS. 1A-1H. FIG. 4 illustrates a device 17 which has an added salicide formation step that occurs after the process steps illustrated in FIG. 1H. Salicide formations 36 are formed overlying a large portion of gate 16 and overlying the source and drain regions 28 that are exposed between the thick gate dielectric 24 and the dielectric layer 30. The salicide formations 36 may consume some of the underlying material depending on the composition of the underlying material and the formation technique. Salicide regions are useful for making lower resistive electrical connections to current electrode regions such as the source and drain regions 28 and/or the control region, gate 16.

It is to be understood that this invention is not limited to the particular forms shown and that it is intended in the appended claims to cover all modifications that do not depart from the spirit and scope of this invention. For example, use of the invention is not limited to the use of salicide for the source, drain and gate overlying formation as illustrated in FIG. 4.

In summary, device 11 of FIG. 1H provides the advantages of a thin gate dielectric FET and the advantages of a thick gate dielectric FET while at the same time avoiding the disadvantages of both thin and thick gate dielectric FETs.

Firstly, due to the fact that the thin gate dielectric 14 is centrally located to overlie most of the channel region between the source and drain regions 28, the channel region will be capable of carrying larger currents as would a thin gate dielectric FET. The ability of a FET to carry larger currents results in larger gain which is beneficial.

Secondly, the thin gate dielectric 14 which covers most of the channel region results in improved short channel behavior. In other words, the channel region holds a more stable potential as the distance between the source and drain or the channel length is reduced, i.e., as the device is shrunk in size to the submicron range and beyond. This stable channel potential reduces the previously mentioned drain induced barrier lowering (DIBL) which adversely effects turn on or threshold voltages.

Thirdly, the thicker gate dielectric 24, which is shown in FIG. 1H, is placed strategically between the areas where the source 28 and the gate 16, and the drain 28 and the gate 16 are in the closest proximity to one another. It is these two regions that have a high potential for current leakage. Current leakage and gate dielectric damage resulting in degraded lifetime caused by hot carrier injection is reduced by the thicker gate dielectric 24. In addition, the thicker gate dielectric 24 reduces valence band to conduction band current leakage because the thicker oxide reduces the normally excessive electric fields that bend both of the bands to a higher rate of current leakage.

Fourthly, the thicker gate dielectric 24 reduces Miller Capacitance between the source 28 and the gate 16, and the drain 28 and the gate 16 primarily because Miller capacitance is proportional to the inverse of the dielectric gate 24 thickness. The reduction in capacitance allows the device to operate at faster switching frequencies and allows the device to gain all the other benefits resulting from quicker operation as well.

Finally, because device 11 resembles a nonoverlap FET configuration, the device can be sized much smaller than current conventional devices. It is also important to reiterate that device 11 can be used with existing technology such as threshold implants, LDD technology, selective silicon epitaxy, salicide growth, and other techniques to further improve performance for certain applications.

While the present invention has been illustrated and described with reference to specific embodiments, further modifications and improvements will occur to those skilled in the art. By now it should be apparent that there has been provided a process for making a FET having a gate dielectric with at least two different thicknesses that result in several stated advantages. It is to be understood, therefore, that this invention is not limited to the particular forms shown and that it is intended in the appended claims to cover all modifications that do not depart from the spirit and scope of this invention.

We claim:

1. A process for forming a field effect transistor having a gate dielectric with variable thickness, comprising the steps of:

providing a semiconductor substrate;

forming a dielectric overlying the substrate and having a first thickness;

forming a control electrode on the dielectric with a first predetermined width;

forming a non-oxidizing film of material around the control electrode;

increasing the first thickness of the dielectric to a second thickness adjacent a perimeter of the control electrode;

removing the non-oxidizing film of material from the control electrode after the second thickness of the dielectric has been formed;

extending the first predetermined width of the control electrode by laterally enlarging the control electrode to a second predetermined width after the second thickness of the dielectric is formed so that the dielectric which is below the control electrode has a thickness in a central portion beneath the control electrode which is less than an outer perimeter portion beneath the control electrode; and forming first and second current electrodes in the semiconductor substrate to form a channel region underlying the control electrode.

2. The process for forming the field effect transistor of claim 1 further comprising the step of:

forming third and fourth current electrode regions underlying a portion of the second predetermined thickness of the gate dielectric, the third current electrode region being adjacent to the first current electrode region and having the second conductivity type but being electrically doped lighter than the first current electrode region, the fourth current electrode region being adjacent to the second current electrode region and having the second conductivity type but being electrically doped lighter than the second current electrode region.

3. The process for forming the field effect transistor of claim 1 further comprising the step of:

forming first and second current electrode extensions respectively overlying a portion of said first and second current electrode regions, for respectively making electrical contact to the first and second current electrode regions.

4. The process for forming the field effect transistor of claim 1 further comprising the step of:

forming a layer of conductive material overlying a portion of each of said first and second current electrode regions and at least a portion of said control electrode, the conductive material making electrical contact to the first and second current electrode regions and the control electrode.

5. The process of claim 4 wherein the step of forming a layer of conductive material further comprises using salicide as the conductive material.

* * * * *